(12) United States Patent
Xing

(10) Patent No.: US 11,658,779 B2
(45) Date of Patent: May 23, 2023

(54) RESOURCE MAPPING METHOD AND APPARATUS AND DEVICE

(71) Applicant: China Academy of Telecommunications Technology, Beijing (CN)

(72) Inventor: Yanping Xing, Beijing (CN)

(73) Assignee: DATANG MOBILE COMMUNICATIONS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 16/959,707

(22) PCT Filed: Dec. 12, 2018

(86) PCT No.: PCT/CN2018/120741
§ 371 (c)(1),
(2) Date: Jul. 2, 2020

(87) PCT Pub. No.: WO2019/134487
PCT Pub. Date: Jul. 11, 2019

(65) Prior Publication Data
US 2020/0382249 A1    Dec. 3, 2020

(30) Foreign Application Priority Data
Jan. 3, 2018   (CN) .......................... 201810004885.0

(51) Int. Cl.
*H04L 5/00* (2006.01)
*H03M 13/27* (2006.01)
*H04L 1/00* (2006.01)

(52) U.S. Cl.
CPC ...... *H04L 5/0044* (2013.01); *H03M 13/2778* (2013.01); *H04L 1/0071* (2013.01); *H04L 5/001* (2013.01)

(58) Field of Classification Search
CPC ..... H04L 1/0071; H04L 5/001; H04L 5/0044; H04M 13/2778
See application file for complete search history.

(56) References Cited

U.S. PATENT DOCUMENTS

| | | | | |
|---|---|---|---|---|
| 2003/0156659 A1* | 8/2003 | Hanaoka | ............... | H04L 1/0066 375/298 |
| 2009/0175231 A1* | 7/2009 | Seo | ........................ | H04L 5/0041 370/329 |

(Continued)

FOREIGN PATENT DOCUMENTS

| | | |
|---|---|---|
| CN | 102148791 A | 8/2011 |
| CN | 102412951 A | 4/2012 |

(Continued)

OTHER PUBLICATIONS

Vivo, "Discussion on PRB Bundling for DL", 3GPP TSG RAN WG1 Meeting #90, Prague, P.R. Czech, Aug. 21-25, 2017, total 6 pages, R1-1712833.

(Continued)

*Primary Examiner* — Kevin C. Harper
(74) *Attorney, Agent, or Firm* — Kilpatrick Townsend & Stockton, LLP

(57) ABSTRACT

Disclosed by the present application are a resource mapping method and apparatus and device, comprising: determining to-be-sent data hosted on a data-channel physical downlink shared channel (PDSCH)/physical uplink shared channel (PUSCH); mapping said to-be-sent data to a virtual resource block (VRB); mapping the virtual resource block to a physical resource block (PRB) in resource block (RB) bundle units. Using the present application, it is possible to prevent the problem of the size of a virtual resource block bundle being inconsistent with the size of a physical resource block bundle, thus causing it to be impossible to (Continued)

map the virtual resource block to the physical resource block.

16 Claims, 6 Drawing Sheets

(56) References Cited

U.S. PATENT DOCUMENTS

| | | | |
|---|---|---|---|
| 2014/0112283 A1 | 4/2014 | Kim et al. | |
| 2016/0218824 A1 | 7/2016 | Kim et al. | |
| 2018/0192406 A1* | 7/2018 | Tang | H04W 72/1263 |
| 2019/0150118 A1* | 5/2019 | Nam | H04L 1/0071 370/329 |
| 2019/0364602 A1* | 11/2019 | Yi | H04W 72/04 |

FOREIGN PATENT DOCUMENTS

| | | |
|---|---|---|
| CN | 103326846 A | 9/2013 |
| CN | 103907301 A | 7/2014 |
| CN | 105634708 A | 6/2016 |
| EP | 2077650 A2 | 7/2009 |
| EP | 2355397 A2 | 8/2011 |
| JP | 2011507331 A | 3/2011 |
| KR | 20090076780 A | 7/2009 |
| WO | 2017143529 A1 | 8/2017 |

OTHER PUBLICATIONS

Qualcomm Incorporated,"Remaining Details on DL/UL Resource Allocation", 3GPP TSG-RAN WG1 Meeting #91, Nov. 27-Dec. 1, 2017, total 8 pages, R1-1720687.

Qualcomm Incorporated, "Discussion on VRB-to-PRB mapping and TB size determination",3GPP TSG RAN WG1 NR Adhoc #3, Sep. 18-21, 2017, Nagoya, Japan, total 8 pages, R1-1716428.

LG Electronics,"Discussion on resource allocation and TBS determination", 3GPP TSG RAN WG1 Meeting 91, Reno, USA, Nov. 27-Dec. 1, 2017, total 17 pages, R1-1719929.

* cited by examiner

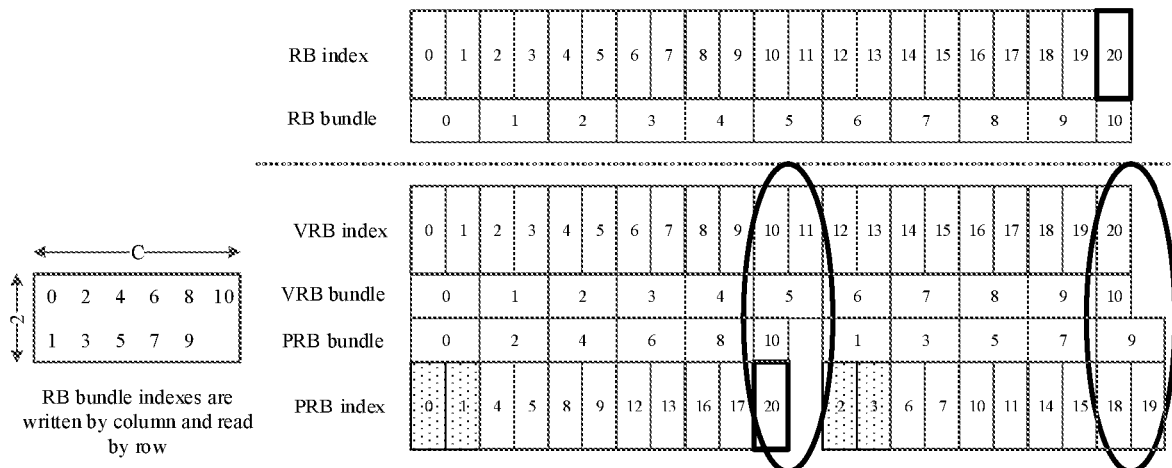
Fig.3
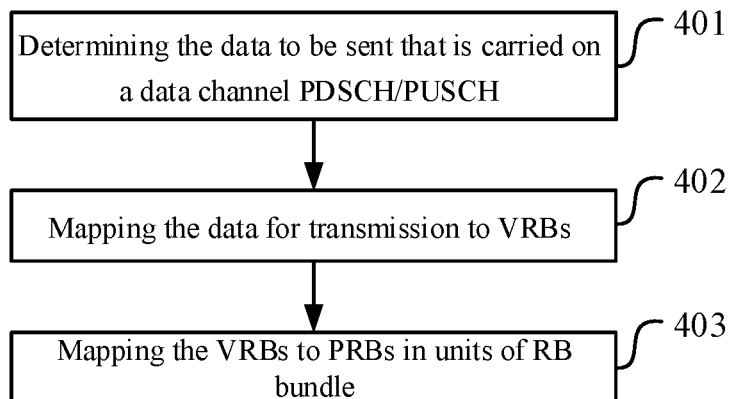
Fig.4
Fig.5

| RB index | 0 | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|---|
| RB bundle | 0 | | 1 | | 2 | | 3 | | 4 | | 5 | | 6 | | 7 | | 8 | | 9 | | 10 |

Fig.9

RB buddle indexes are written by column and read by row

```
1  3  5  7  9
2  4  6  8  10
```

| VRB buddle | 0 | | 1 | | 2 | | 3 | | 4 | | 5 | | 6 | | 7 | | 8 | | 9 | | 10 |
|---|---|---|---|---|---|---|---|---|---|---|---|---|---|---|---|---|---|---|---|---|---|
| VRB index | 0 | 1 | 2 | 3 | 4 | 5 | 6 | 7 | 8 | 9 | 10 | 11 | 12 | 13 | 14 | 15 | 16 | 17 | 18 | 19 | 20 |
| PRB index | 0 | 1 | 2 | 3 | 6 | 7 | 10 | 11 | 20 | 21 | 10 | 11 | 4 | 5 | 8 | 9 | 12 | 13 | 16 | 17 | 20 |
| PRB buddle | 0 | | 1 | | 3 | | 5 | | 7 | | 9 | | 2 | | 4 | | 6 | | 8 | | 10 |

Fig.10

| | C | | | VRB index | 0 | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|---|---|---|---|---|
| 0 | 4 | 8 | | VRB buddle | 0 | | 1 | | 2 | | 3 | | 4 | | 5 | | 6 | | 7 | | 8 | | 9 | | 10 |
| 1 | 5 | 9 | | | | | | | | | | | | | | | | | | | | | | | | |
| 2 | 6 | Null | | PRB buddle | 0 | | 4 | | 8 | | 1 | | 5 | | 9 | | 2 | | 6 | | 3 | | 7 | | 10 |
| 3 | 7 | 10 | | PRB index | 0 | 1 | 8 | 9 | 16 | 17 | 2 | 3 | 10 | 11 | 18 | 19 | 4 | 5 | 12 | 13 | 6 | 7 | 14 | 15 | 20 |

RB buddle indexes are written
by column and written by row

Fig.14

| | | C | | | | VRB index | 0 | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|---|---|---|---|---|---|---|
| 0 | 2 | 4 | 6 | 8 | Null | VRB buddle | 0 | | 1 | | 2 | | 3 | | 4 | | 5 | | 6 | | 7 | | 8 | | 9 | | 10 |
| 1 | 3 | 5 | 7 | 9 | 10 | PRB buddle | 0 | | 2 | | 4 | | 6 | | 8 | | 1 | | 3 | | 5 | | 7 | | 9 | | 10 |
| | | | | | | PRB index | 0 | 1 | 4 | 5 | 8 | 9 | 12 | 13 | 16 | 17 | 2 | 3 | 6 | 7 | 10 | 11 | 14 | 15 | 18 | 19 | 20 |

RB buddle indexes are written
by column and read by row

Fig.15

RESOURCE MAPPING METHOD AND APPARATUS AND DEVICE

The present application is a US National Stage of International Application No. PCT/CN2018/120741, filed on Dec. 12, 2018, which claims the priority from Chinese Patent Application No. 201810004885.0, filed with the China National Intellectual Property Administration on Jan. 3, 2018 and entitled "Resource Mapping Method and Apparatus and Device", which are hereby incorporated by reference in their entireties.

FIELD

The present application relates to the field of wireless communication technologies and particularly to a resource mapping method, apparatus and device.

BACKGROUND

In the NR (Next generation Radio) technology, the data to be sent that is carried by the data channel PDSCH (Physical Downlink Shared Channel)/PUSCH (Physical Uplink Shared Channel) is firstly mapped to a VRB (Virtual Resource Block), and then the VRB is mapped to a PRB (Physical Resource Block).

There are two types of VRB-to-PRB mapping: interleaved mapping and non-interleaved mapping. The non-interleaved VRB-to-PRB mapping refers to that the VRB n is directly mapped to the PRB n. While for the interleaved VRB-to-PRB mapping, the unit is RB bundle (RB: Resource Block), and the VRB bundle j is mapped to the PRB bundle f(j).

The deficiency of the prior art is that there are cases in which the mapping from VRB to PRB cannot be finished.

SUMMARY

The present application provides a resource mapping method and apparatus and device, to solve the problem that the existing VRB-to-PRB mapping may cause the VRB bundle and the PRB bundle to be inconsistent in size so that the VRB-to-PRB mapping cannot be performed.

A resource mapping method provided in an embodiment of the present application includes:

determining data to be sent that is carried on a data channel PDSCH/PUSCH;

mapping the data to be sent to VRBs;

mapping the VRBs to PRBs in units of RB bundle.

In one embodiment, mapping the VRBs to the PRBs in units of RB bundle, includes:

determining M VRB bundles with lower frequency and/or L VRB bundles with higher frequency in RBs occupied by the data channel;

fixedly mapping the M VRB bundles with lower frequency and/or L VRB bundles with higher frequency to PRB bundles with same indexes as the VRB bundles;

determining PRB bundle indexes corresponding to remaining VRB bundles through interleaved mapping.

In one embodiment, the M VRB bundles with lower frequency include:

$M=N-\lfloor N/P \rfloor \times P$, where N is the number of RB bundles in a Band Width Part (BWP), and P is the number of rows or columns of an interleaver.

In one embodiment, the L VRB bundles with higher frequency include:

$L=N-\lfloor N/P \rfloor \times P$, where N is the number of RB bundles in a BWP, and P is the number of rows or columns of an interleaver.

In one embodiment, P is the number of rows or columns of the interleaver, including:

if the number of rows of the interleaver is fixed, P is the number of rows of the interleaver;

if the number of columns of the interleaver is fixed, P is the number of columns of the interleaver.

In one embodiment, the L VRB bundles with higher frequency include a case that L=1.

In one embodiment, mapping the VRBs to the PRBs in units of RB bundle, includes:

determining PRB bundle indexes corresponding to all VRB bundles through interleaved mapping;

inserting (C*R−N) nulls in a last row or last column of an interleaver, and ignoring nulls when reading out from the interleaver, where N is the number of RB bundles in a BWP, R is the number of rows of the interleaver, and C is the number of columns of the interleaver.

In one embodiment, inserting (C*R−N) nulls in a last row or last column of an interleaver, includes:

the inserted nulls do not occupy a last element position of the last row or last column of the interleaver.

In one embodiment, inserting (C*R−N) nulls in a last row or last column of an interleaver, includes:

if VRB bundle indexes are written into the interleaver by row and read out from the interleaver by column, then inserting (C*R−N) nulls in the last row or last column of the interleaver by inserting (C*R−N) nulls in the last row of the interleaver;

if VRB bundle indexes are written into the interleaver by column and read out from the interleaver by row, then inserting (C*R−N) nulls in the last row or last column of the interleaver by inserting (C*R−N) nulls in the last column of the interleaver.

In one embodiment, before mapping the VRB to the PRB in units of RB bundle, the method further includes:

determining the number of RB bundles in a BWP and/or whether the size of a last RB bundle is less than L, and determining whether to map the VRBs to the PRBs in units of RB bundle according to a determining result, where L is the size of a RB bundle.

In one embodiment, determining the number of RB bundles in a BWP, includes:

determining whether the number of RB bundles in the BWP is an integer multiple of the number of interleaver rows or the number of interleaver columns.

In one embodiment, determining whether the number of RB bundles in the BWP is an integer multiple of the number of interleaver rows or the number of interleaver columns, includes:

if the number of interleaver rows is fixed, determining whether the number of RB bundles in the BWP is an integer multiple of the number of interleaver rows;

if the number of interleaver columns is fixed, determining whether the number of RB bundles in the BWP is an integer multiple of the number of interleaver columns.

A computer device provided in an embodiment of the present application includes a memory, a processor and a computer program that is stored on the memory and can run on the processor, where the processor, when executing the computer program, implements the following method:

determining data to be sent that is carried on a data channel PDSCH/PUSCH;

mapping the data to be sent to VRBs;

mapping the VRBs to PRBs in units of RB bundle.

In an implementation, mapping the VRBs to the PRBs in units of RB bundle, includes:

determining M VRB bundles with lower frequency and/or L VRB bundles with higher frequency in RBs occupied by the data channel;

fixedly mapping the M VRB bundles with lower frequency and/or L VRB bundles with higher frequency to PRB bundles with same indexes as the VRB bundles;

determining PRB bundle indexes corresponding to remaining VRB bundles through interleaved mapping.

In one embodiment, the M VRB bundles with lower frequency include:

$M = N - \lfloor N/P \rfloor \times P$, where N is the number of RB bundles in a BWP, and P is the number of rows or columns of an interleaver.

In one embodiment, the L VRB bundles with higher frequency include:

$L = N - \lfloor N/P \rfloor \times P$, where N is the number of RB bundles in a BWP, and P is the number of rows or columns of an interleaver.

In one embodiment, P is the number of rows or columns of the interleaver, including:

if the number of rows of the interleaver is fixed, P is the number of rows of the interleaver;

if the number of columns of the interleaver is fixed, P is the number of columns of the interleaver.

In one embodiment, the L VRB bundles with higher frequency include a case that L=1.

In one embodiment, mapping the VRB to a PRB in units of RB bundle, includes:

determining PRB bundle indexes corresponding to all VRB bundles through interleaved mapping;

inserting (C*R−N) nulls in a last row or last column of an interleaver, and ignoring nulls when reading out from the interleaver, where N is the number of RB bundles in a BWP, R is the number of rows of the interleaver, and C is the number of columns of the interleaver.

In one embodiment, inserting (C*R−N) nulls in a last row or last column of an interleaver, includes:

the inserted nulls do not occupy a last element position of the last row or last column of the interleaver.

In one embodiment, inserting (C*R−N) nulls in a last row or last column of an interleaver, includes:

if VRB bundle indexes are written into the interleaver by row and read out from the interleaver by column, then inserting (C*R−N) nulls in the last row or last column of the interleaver by inserting (C*R−N) nulls in the last row of the interleaver;

if VRB bundle indexes are written into the interleaver by column and read out from the interleaver by row, then inserting (C*R−N) nulls in the last row or last column of the interleaver by inserting (C*R−N) nulls in the last column of the interleaver.

In one embodiment, before mapping the VRBs to the PRBs in units of RB bundle, the method further includes:

determining the number of RB bundles in a BWP and/or whether the size of a last RB bundle is less than L, and determining whether to map the VRB to the PRB in units of RB bundle according to a determining result, where L is the size of a RB bundle.

In one embodiment, determining the number of RB bundles in a BWP, includes:

determining whether the number of RB bundles in the BWP is an integer multiple of the number of interleaver rows or the number of interleaver columns.

In one embodiment, determining whether the number of RB bundles in the BWP is an integer multiple of the number of interleaver rows or the number of interleaver columns, includes:

if the number of interleaver rows is fixed, determining whether the number of RB bundles in the BWP is an integer multiple of the number of interleaver rows;

if the number of interleaver columns is fixed, determining whether the number of RB bundles in the BWP is an integer multiple of the number of interleaver columns.

An embodiment of the present application provides a computer readable storage medium storing a computer program that performs the resource mapping method described above.

A resource mapping apparatus provided in an embodiment of the present application includes:

a determining device configured to determine data to be sent that is carried on a data channel PDSCH/PUSCH;

a mapping device configured to map the data to be sent to VRBs, and map the VRBs to PRBs in units of RB bundle.

The present application has the following beneficial effects.

The technical solution provided by the embodiments of the present application can avoid the problem that the VRB bundle and the PRB bundle are inconsistent in size so that the VRB-to-PRB mapping cannot be performed.

BRIEF DESCRIPTION OF THE DRAWINGS

The accompanying drawings illustrated here are used to provide the further understanding of the present application and constitute a part of the present application, and the schematic embodiments of the present application and the illustration thereof are used to explain the present application but not limit the present application improperly. In the accompanying drawings:

FIG. 3 is a schematic diagram of inconsistent interleaved mapping of 11 RB bundles in an embodiment of the present application;

FIG. 4 is a schematic flow diagram of a resource mapping method in an embodiment of the present application;

FIG. 5 is a schematic diagram of the correspondence between RB indexes and RB bundle indexes in a first embodiment of the present application;

FIG. 9 is a schematic diagram of the correspondence between RB indexes and RB bundle indexes in a second embodiment of the present application;

FIG. 10 is a schematic diagram of the correspondences between VRB indexes, VRB bundle indexes, PRB bundle indexes and PRB indexes in the second embodiment of the present application;

FIG. 14 is a schematic diagram of the correspondences between VRB indexes, VRB bundle indexes, PRB bundle indexes and PRB indexes when nulls being filled in the last column of the interleaver in the third embodiment of the present application;

FIG. 15 is a schematic diagram of the correspondences between VRB indexes, VRB bundle indexes, PRB bundle indexes and PRB indexes with an integer multiple of RBG being satisfied in the third embodiment of the present application.

DETAILED DESCRIPTION OF THE EMBODIMENTS

The inventor noticed the following in the inventive process.

Figures 1, 2:
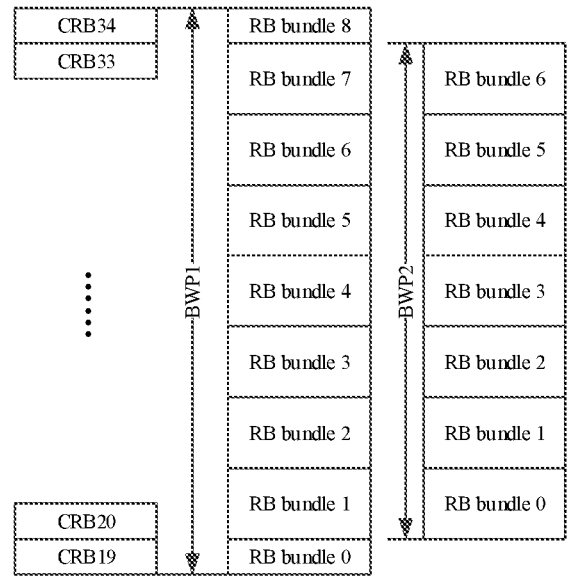
FIG. 1 is a schematic diagram illustrating the size correspondence of RB bundles in an embodiment of the present application.
FIG. 2 is a schematic diagram of interleaved mapping of 12 RB bundles in an embodiment of the present application.

For the interleaved VRB-to-PRB mapping, the unit is RB bundle, and the size of the RB bundle is notified by the network side and is denoted as L during the process of mapping the VRB bundle j to the PRB bundle f(j). The size of the first RB bundle is $L-N_{BWP,i}^{start} \mod L$, where $N_{BWP,i}^{start}$ is the starting CRB (Common Resource Block) index of the BWP (Band Width Part). Taking L=2 as an example, if the starting CRB index of the BWP is an odd number, the size of the first RB bundle is 1 RB; otherwise, the size of the first RB bundle is 2 RBs. FIG. 1 is a schematic diagram of the correspondence of the sizes of RB bundles, where the correspondence between RB bundles and CRBs is as shown in FIG. 1.

The mapping from the VRB bundle j to the PRB bundle f(j) needs to satisfy:

f(j)=rC+c
j=cR+r
r=0,1, . . . , R−1
c=0,1, . . . , C−1
R=2
$C=\lceil N_{BWP,i}^{size}/(LR) \rceil$ here L is the size of the RB bundle, and $N_{BWP,i}^{size}$ is the size of the BWP. The above formula is to write the RB bundle indexes into a 2-row and C-column interleaver by column and then read them out by row to realize the interleaved mapping from the VRB bundle indexes to the PRB bundle indexes. Here the number C of interleaver columns is the number of RB bundles in the BWP divided by the number of interleaver rows and then rounded up.

In the prior art, other methods are also used to express the interleaved mapping, e.g., the matrix method. Conversion is performed according to the predetermined rules or protocol requirements during the interleaved mapping. The embodiments of the present application will mainly take the above formula as an example to illustrate by way of a row-column interleaver.

In one embodiment, for example, it is assumed that $N_{BWP,i}^{start}=0$, $N_{BWP,i}^{size}=24$ and L=2. FIG. 2 is a schematic diagram of the interleaved mapping of 12 RB bundles. As shown, there are 12 RB bundles in the BWP, and the number of interleaver columns is C=6. The VRB bundle indexes are written into the 2-row and 6-column interleaver by column and then read out by row to realize the interleaved mapping from the VRB bundle indexes to the PRB bundle indexes. The VRB bundles 0, 1, 2, 3, 4, 5, 6, 7, 8, 9, 10, 11 are mapped to the PRB bundles 0, 2, 4, 6, 8, 10, 1, 3, 5, 7, 9, 11 respectively, as shown in FIG. 2.

In the prior art, due to the starting CRB index of the BWP, the size of the BWP, and the size of the RB bundle, the size of the first and last RB bundles in the BWP may be smaller than the size L of the RB bundle notified by the network side.

When the size of the first RB bundle is less than L, the VRB bundle 0 is fixedly mapping to the PRB bundle 0, so there will be no such problem that the size of the VRB bundle is inconsistent with the size of the PRB bundle. However, when the size of the last RB bundle is less than L, if the number of RB bundles in the BWP is an odd number, the situation where the VRB bundle is inconsistent with the PRB bundle in size may occur according to the existing VRB-to-PRB mapping rules. FIG. 3 is a schematic diagram illustrating the inconsistent interleaved mapping of 11 RB bundles. It needs to be noted that some parts are shown by bold line boxes and circles. As shown, it is assumed that $N_{BWP,i}^{size}=21$ and L=2 in the figure. At this time, the VRB-to-PRB mapping cannot be finished especially when the number of RBs of the VRB bundle is greater than that of the PRB bundle.

Based on this, the technical solution provided by the embodiments of the present application is intended to solve the problem that the existing VRB-to-PRB mapping may cause the VRB bundle and the PRB bundle to be inconsistent in size so that the VRB-to-PRB mapping cannot be performed. The specific embodiments of the present application will be illustrated below in combination with the drawings.

FIG. 4 is a schematic flow diagram of a resource mapping method, as shown, which includes:

Step 401: determining the data to be sent that is carried on a data channel PDSCH/PUSCH. Here, the data channel is the PDSCH/PUSCH;

Step 402: mapping the data to be sent to VRBs; and

Step 403: mapping the VRBs to PRBs in units of RB bundle.

The specific ways of mapping the VRBs to the PRBs in units of RB bundle will be illustrated below in combination with examples.

1. Mapping the VRBs to the PRBs in units of RB bundle, includes:

determining M VRB bundles with lower frequency and/or L VRB bundles with higher frequency in the RBs occupied by the data channel;

fixedly mapping the M VRB bundles with lower frequency and/or L VRB bundles with higher frequency to the PRB bundles with the same indexes as the VRB bundles;

determining the PRB bundle indexes corresponding to the remaining VRB bundles through interleaved mapping.

In an implementation, the M VRB bundles with lower frequency include:

$M=N-\lfloor N/P \rfloor \times P$, where N is the number of RB bundles in the BWP, and P is the number of rows or columns of an interleaver.

In an implementation, the L VRB bundles with higher frequency include:

L=N−⌊N/P⌋×P, where N is the number of RB bundles in the BWP, and P is the number of rows or columns of an interleaver.

Further, in an implementation, P is the number of rows or columns of the interleaver, including:

if the number of rows of the interleaver is fixed, P is the number of rows of the interleaver;

if the number of columns of the interleaver is fixed, P is the number of columns of the interleaver.

In an implementation, the L VRB bundles with higher frequency include a case that L=1.

First Embodiment

In this embodiment, it is assumed that the number of RB bundles in the BWP is N, and they are numbered as 0, 1, . . . , N−1 in order from low to high frequency. Then, in the interleaved VRB-to-PRB mapping, the VRB bundle N−1 is fixedly mapped to the PRB bundle N−1; and the interleaved mapping is performed on the VRB bundle 0 to VRB bundle N−2 based on their bundle indexes to determine the corresponding PRB bundle indexes.

Specifically, FIG. 5 is a schematic diagram of the correspondence between RB indexes and RB bundle indexes in the first embodiment. As shown, it is assumed that $N_{BWP,i}^{start}=0$, $N_{BWP,i}^{size}=21$ and L=2, and the RB bundle division is as shown in FIG. 5. Here there are 11 RB bundles, and the RB bundle 10 contains only one RB.

Figure 6:
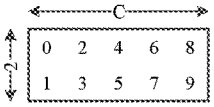
FIG. 6 is a schematic diagram of the correspondences between VRB indexes, VRB bundle indexes, PRB bundle indexes and PRB indexes in the first embodiment of the present application.

Then the VRB bundle 10 is fixedly mapped to the PRB bundle 10, and the interleaved mapping is performed on the VRB bundle 0 to VRB bundle 9 according to their bundle indexes to determine the corresponding PRB bundle indexes. FIG. 6 is a schematic diagram of the correspondences between VRB indexes, VRB bundle indexes, PRB bundle indexes and PRB indexes in the first embodiment. As shown, it is assumed that the interleaved mapping from VRB bundles to PRB bundles follows the existing mapping method in the NR, then the VRB bundles 0, 1, 2, 3, 4, 5, 6, 7, 8, 9 are mapped to the PRB bundles 0, 2, 4, 6, 8, 1, 3, 5, 7, 9 respectively, as shown in FIG. 6.

In an implementation, the rows and columns of the interleaver are interchangeable. For example, the number of columns of the interleaver is fixed to 2, and the number of rows is variable based on the BWP size and bundle size. Correspondingly, the RB bundle indexes are written by row and read out by column.

In addition, the interleaved mapping from VRB bundles to PRB bundles is not limited to the existing mapping method in the NR, because its essence is just the correspondence transformation between indexes. The technical solution provided by the embodiments of the present application does not limits the specific index correspondence rule, so the use of other methods will not affect the implementation of the embodiments of the present application.

Figure 7:
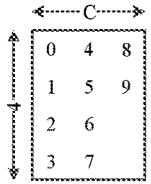
FIG. 7 is a schematic diagram of the correspondences between VRB indexes, VRB bundle indexes, PRB bundle indexes and PRB indexes of the 4-row interleaver in the first embodiment of the present application.

For example, the number of rows of the above interleaver is increased to 4, and the number of columns is decreased accordingly. The above assumption is still followed. FIG. 7 is a schematic diagram of the correspondences between VRB indexes, VRB bundle indexes, PRB bundle indexes and PRB indexes of the 4-row interleaver in the first embodiment. Then the VRB bundles 0, 1, 2, 3, 4, 5, 6, 7, 8, 9 are mapped to the PRB bundles 0, 4, 8, 1, 5, 9, 2, 6, 3, 7 respectively, as shown in FIG. 7.

Figure 8:
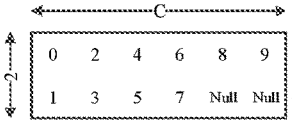
FIG. 8 is a schematic diagram of the correspondences between VRB indexes, VRB bundle indexes, PRB bundle indexes and PRB indexes of the 6-column interleaver in the first embodiment of the present application.

As another example, it is assumed that the number of RBs between the starting RB of the VRB bundle 0 and the starting RB of the VRB bundle 1 in the interleaved mapping from VRB bundles to PRB bundles is required to be an integer multiple of RBG that is, C*L is an integer multiple of the RBG size, i.e., $$C = \left\lceil \frac{L_{total} * L}{2 * RBG} \right\rceil * \frac{RBG}{L},$$

where $L_{total}$ is the total number of RB bundles that involved in interleaving. And it is agreed that the $C*2-L_{total}$ elements in the last row of the interleaver are empty, and the position where the element is empty is not written with VRB bundle indexes during the writing process and not read out from when the PRB bundle indexes are read out. The above assumption is still followed, and it is further assumed that the size of the RBG (Resource Block Group) corresponding to the BWP is 4 (the size of the RBG is always an integer multiple of the size of the RB bundle). FIG. 8 is a schematic diagram of the correspondences between VRB indexes, VRB bundle indexes, PRB bundle indexes and PRB indexes of the 6-column interleaver in the first embodiment. Then the number C of the interleaver columns is increased to 6, and the VRB bundles 0, 1, 2, 3, 4, 5, 6, 7, 8, and 9 are mapped to the PRB bundles 0, 2, 4, 6, 8, 8, 9, 1, 3, 5, and 7 respectively, as shown in FIG. 8.

Second Embodiment

In this embodiment, it is assumed that the number of RB bundles in the BWP is N, and they are numbered as 0, 1, . . . , N−1 in order from low to high frequency. Then, in the interleaved VRB-to-PRB mapping, the first M VRB bundles are fixedly and directly mapped to the PRB indexes with the same indexes as the VRB indexes; and the interleaved mapping is performed on the VRB bundle M to VRB bundle N−1 according to their bundle indexes to determine the corresponding PRB bundle indexes.

Assuming the number of interleaver rows is fixed to R, then $$M = N - \left\lfloor \frac{N}{R} \right\rfloor * R.$$

Specifically, FIG. 9 is a schematic diagram of the correspondence between RB indexes and RB bundle indexes in the second embodiment. As shown, the assumption of the first embodiment is still followed, where $N_{BWP,i}^{start}=0$, $N_{BWP,i}^{size}=21$ and L=2. The RB bundle division is as shown in FIG. 9.

Assuming that an NR interleaver is used and the number of interleaver rows is fixed to R=2, then M=11−⌊11/2⌋*2=1, where the VRB bundle 0 is fixedly mapped to the PRB bundle 0, and the interleaved mapping is performed on the VRB bundle 1 to VRB bundle 10 according to their bundle indexes to determine the corresponding PRB bundle indexes. FIG. 10 is a schematic diagram of the correspondences between VRB indexes, VRB bundle indexes, PRB bundle indexes and PRB indexes in the second embodiment, and the details are as shown in FIG. 10.

Figure 11:
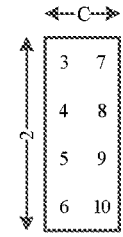
FIG. 11 is a schematic diagram of the correspondences between VRB indexes, VRB bundle indexes, PRB bundle indexes and PRB indexes of the 4-row interleaver in the second embodiment of the present application.

FIG. 11 is a schematic diagram of the correspondences between VRB indexes, VRB bundle indexes, PRB bundle indexes and PRB indexes of the 4-row interleaver in the second embodiment. Assuming that the number of interleaver rows is R=4, then M=11−⌊11/4⌋*4=3, where the VRB bundle 0 to VRB bundle 2 are fixedly mapped to the PRB bundle 0 to PRB bundle 2 respectively, and the interleaved mapping is used for the VRB bundle 3 to VRB bundle 10 to determine the corresponding PRB bundle indexes. The details are as shown in FIG. 11.

2. Mapping the VRBs to the PRBs in units of RB bundle, includes:

determining the PRB bundle indexes corresponding to all VRB bundles through interleaved mapping;

inserting (C*R−N) nulls in the last row or last column of an interleaver, and ignoring nulls when reading out from the interleaver.

Here N is the number of RB bundles in the BWP, R is the number of rows of the interleaver, and C is the number of columns of the interleaver.

In an implementation, inserting (C*R−N) nulls in the last row or last column of an interleaver, includes:

the inserted nulls do not occupy the last element position of the last row or last column of the interleaver.

In an implementation, the inserting (C*R−N) nulls in the last row or last column of an interleaver, includes:

if the VRB bundle indexes are written into the interleaver by row and read out from the interleaver by column, then inserting (C*R−N) nulls in the last row or last column of the interleaver by inserting (C*R−N) nulls in the last row of the interleaver;

if the VRB bundle indexes are written into the interleaver by column and read out from the interleaver by row, then inserting (C*R−N) nulls in the last row or last column of the interleaver by inserting (C*R−N) nulls in the last column of the interleaver.

Third Embodiment

In this embodiment, it is assumed that the number of RB bundles in the BWP is N, and they are numbered as 0, 1, . . . , N−1 in order from low to high frequency. The number of rows of the interleaver is fixed to R, and the number C of columns of the interleaver is variable based on the BWP size and the bundle size (the rows and columns of the interleaver may be interchanged in the implementation). The VRB bundle indexes are written into the interleaver by column and read out by row. The first (C*R−N) rows in the last column of the interleaver are filled with nulls, and the positions filled with null are not written with VRB bundle indexes during writing and not read out from when the PRB bundle indexes are read out.

Figure 12:
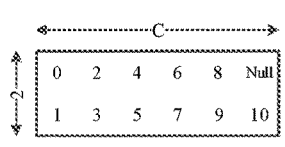
FIG. 12 is a schematic diagram of the correspondences between VRB indexes, VRB bundle indexes, PRB bundle indexes and PRB indexes in a third embodiment of the present application.

FIG. 12 is a schematic diagram of the correspondences between VRB indexes, VRB bundle indexes, PRB bundle indexes and PRB indexes in the third embodiment. Assuming that an NR interleaver is used and the number of rows of the interleaver is R=2, then the first 2*6−11=1 row in the last column of the interleaver is filled with null, as shown in FIG. 12.

Figure 13:
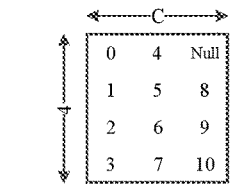
FIG. 13 is a schematic diagram of the correspondences between VRB indexes, VRB bundle indexes, PRB bundle indexes and PRB indexes of the 4-row interleaver in the third embodiment of the present application.

FIG. 13 is a schematic diagram of the correspondences between VRB indexes, VRB bundle indexes, PRB bundle indexes and PRB indexes of the 4-row interleaver in the third embodiment. Assuming that the number of rows of the interleaver is increased to R=4, then the first 4*3−11=1 row in the last column of the interleaver is filled with null, as shown in FIG. 13.

FIG. 14 is a schematic diagram of the correspondences between VRB indexes, VRB bundle indexes, PRB bundle indexes and PRB indexes when null is filled in the last column of the interleaver in the third embodiment, where the null filled in the last column of the interleaver may also be at another element position except the last row, as shown in FIG. 14.

FIG. 15 is a schematic diagram of the correspondences between VRB indexes, VRB bundle indexes, PRB bundle indexes and PRB indexes where integer multiple of RBG is satisfied in the third embodiment. Assuming that the number of RBs between the starting RB of the VRB bundle 0 and the starting RB of the VRB bundle 1 in the interleaved mapping from VRB bundles to PRB bundles is required to be an integer multiple of RBG, similarly to the first embodiment, then the first 2*6−11=1 row in the last column of the interleaver is filled with null, as shown in FIG. 15.

In an implementation, before mapping the VRB to the PRB in units of RB bundle, the method may further include:

determining the number of RB bundles in the BWP and/or whether the size of the last RB bundle is less than L, and determining whether to map the VRBs to the PRBs in units of RB bundle according to the judgment result, where L is the size of a RB bundle.

The number of RB bundles in the BWP and/or whether the size of the last RB bundle is less than L is/are determined, and it is determined whether to apply the first, second or third embodiment according to the determining result.

In an implementation, the determining the number of RB bundles in the BWP, includes:

determining whether the number of RB bundles in the BWP is an integer multiple of the number of interleaver rows or the number of interleaver columns.

In an implementation, the determining whether the number of RB bundles in the BWP is an integer multiple of the number of interleaver rows or the number of interleaver columns, includes:

if the number of interleaver rows is fixed, determining whether the number of RB bundles in the BWP is an integer multiple of the number of interleaver rows;

if the number of interleaver columns is fixed, determining whether the number of RB bundles in the BWP is an integer multiple of the number of interleaver columns.

The specific implementation may be as follows.

For example, it is determined whether the number of RB bundles in the BWP is an integer multiple of the number of interleaver rows or the number of interleaver columns. If it is not an integer multiple of the number of interleaver rows or the number of interleaver columns, the first, second or third embodiment is applied; otherwise, the interleaved mapping is performed on all the VRB bundles in the BWP according to their bundle indexes to determine the corresponding PRB bundle indexes, for example, using the existing mechanism.

For example, it is determined whether the size of the last RB bundle is less than L. If it is less than L, the first, second or third embodiment is applied; otherwise, the interleaved mapping is performed on all the VRB bundles in the BWP according to their bundle indexes to determine the corresponding PRB bundle indexes, for example, using the existing mechanism.

For example, the number of RB bundles in the BWP and whether the size of the last RB bundle is less than L are determined. If it is determined that the number of RB bundles in the BWP is not an integer multiple of the number of interleaver rows or the number of interleaver columns and the size of the last RB bundle is less than L, the first, second or third embodiment is applied; otherwise, the interleaved mapping is performed on all the VRB bundles in the BWP according to their bundle indexes to determine the corresponding PRB bundle indexes, for example, using the existing mechanism.

Based upon the same inventive concept, the embodiments of the present application further provide a computer device, a computer readable storage medium, and a resource mapping apparatus. Since the principle solving the problem of these devices is similar to the resource mapping method, the implementations of these devices may refer to the implementations of the method, and the repeated description thereof will be omitted here.

A computer device provided in an embodiment of the present application includes a memory, a processor and a computer program that is stored on the memory and can run on the processor, where the processor, when executing the computer program, implements the following method:

determining the data to be sent that is carried on a data channel PDSCH/PUSCH;
mapping the data to be sent to VRBs; and
mapping the VRBs to PRBs in units of RB bundle.

In an implementation, mapping the VRBs to PRBs in units of RB bundle, includes:
determining M VRB bundles with lower frequency and/or L VRB bundles with higher frequency in the RBs occupied by the data channel;
fixedly mapping the M VRB bundles with lower frequency and/or L VRB bundles with higher frequency to the PRB bundles with the same indexes as the VRB bundles; and
determining the PRB bundle indexes corresponding to the remaining VRB bundles through interleaved mapping.

In an implementation, the M VRB bundles with lower frequency include:
$M=N-\lfloor N/P \rfloor \times P$, where N is the number of RB bundles in the BWP, and P is the number of rows or columns of an interleaver.

In an implementation, the L VRB bundles with higher frequency include:
$L=N-\lfloor N/P \rfloor \times P$, where N is the number of RB bundles in the BWP, and P is the number of rows or columns of an interleaver.

In an implementation, P is the number of rows or columns of the interleaver, including:
if the number of rows of the interleaver is fixed, P is the number of rows of the interleaver;
if the number of columns of the interleaver is fixed, P is the number of columns of the interleaver.

In an implementation, the L VRB bundles with higher frequency include a case that L=1.

In an implementation, mapping the VRBs to PRBs in units of RB bundle, includes:
determining the PRB bundle indexes corresponding to all VRB bundles through interleaved mapping; and
inserting (C*R−N) nulls in the last row or last column of an interleaver, and ignoring nulls when reading out from the interleaver;
where N is the number of RB bundles in the BWP, R is the number of rows of the interleaver, and C is the number of columns of the interleaver.

In an implementation, the inserting (C*R−N) nulls in the last row or last column of an interleaver, includes:
the inserted nulls do not occupy the last element position of the last row or last column of the interleaver.

In an implementation, the inserting (C*R−N) nulls in the last row or last column of an interleaver, includes:
if the VRB bundle indexes are written into the interleaver by row and read out from the interleaver by column, then inserting (C*R−N) nulls in the last row or last column of the interleaver by inserting (C*R−N) nulls in the last row of the interleaver;
if the VRB bundle indexes are written into the interleaver by column and read out from the interleaver by row, then inserting (C*R−N) nulls in the last row or last column of the interleaver by inserting (C*R−N) nulls in the last column of the interleaver.

In an implementation, before mapping the VRBs to the PRBs in units of RB bundle, the method further includes:
determining the number of RB bundles in the BWP and/or whether the size of the last RB bundle is less than L, and determining whether to map the VRBs to the PRBs in units of RB bundle according to the determining result, where L is the size of a RB bundle.

In an implementation, the determining the number of RB bundles in the BWP, includes:
determining whether the number of RB bundles in the BWP is an integer multiple of the number of interleaver rows or the number of interleaver columns.

In an implementation, the determining whether the number of RB bundles in the BWP is an integer multiple of the number of interleaver rows or the number of interleaver columns, includes:
if the number of interleaver rows is fixed, determining whether the number of RB bundles in the BWP is an integer multiple of the number of interleaver rows;
if the number of interleaver columns is fixed, determining whether the number of RB bundles in the BWP is an integer multiple of the number of interleaver columns.

An embodiment of the present application provides a computer readable storage medium storing a computer program that performs the resource mapping method described above. The details may refer to the implementations of the computer device.

A resource mapping apparatus provided in an embodiment of the present application includes:
a determining device configured to determine the data to be sent that is carried on a data channel PDSCH/PUSCH; and
a mapping device configured to map the data to be sent to VRBs, and map the VRBs to PRBs in units of RB bundle.

For the sake of description, all the parts of the above-mentioned device are divided into various devices or units by function, which are described respectively. Of course, the functions of the various devices or units may be implemented in the same one or more software or hardware when the present application is implemented.

In summary, the embodiments of the present application provides the mapping solution from the VRB bundle to the PRB bundle, which can avoid the problem that the VRB bundle and the PRB bundle are inconsistent in size so that the VRB-to-PRB mapping cannot be performed.

Embodiments of the present application can provide methods, systems and computer program products. Thus the present application can take the form of hardware embodiments alone, software embodiments alone, or embodiments combining the software and hardware aspects. Also the present application can take the form of computer program products implemented on one or more computer usable storage mediums (including but not limited to magnetic disk memories, CD-ROMs, optical memories and the like) containing computer usable program codes therein.

The present application is described by reference to the flow charts and/or the block diagrams of the methods, the devices (systems) and the computer program products according to the embodiments of the present application. It should be understood that each process and/or block in the flow charts and/or the block diagrams, and a combination of processes and/or blocks in the flow charts and/or the block diagrams can be implemented by the computer program instructions. These computer program instructions can be provided to a general-purpose computer, a dedicated computer, an embedded processor, or a processor of another programmable data processing device to produce a machine, so that an apparatus for implementing the functions specified in one or more processes of the flow charts and/or one or more blocks of the block diagrams is produced by the instructions executed by the computer or the processor of another programmable data processing device.

These computer program instructions can also be stored in a computer readable memory which is guides the computer or another programmable data processing device to operate in a particular way, so that the instructions stored in the computer readable memory produce a manufacture including the instruction apparatus which implements the functions specified in one or more processes of the flow charts and/or one or more blocks of the block diagrams.

These computer program instructions can also be loaded onto the computer or another programmable data processing device, so that a series of operation steps are performed on the computer or another programmable device to produce the computer-implemented processing. Thus the instructions executed on the computer or another programmable device provide steps for implementing the functions specified in one or more processes of the flow charts and/or one or more blocks of the block diagrams.

What is claimed is:

1. A resource mapping method, comprising:
   determining data to be sent that is carried on a data channel Physical Downlink Shared Channel, PDSCH/Physical Uplink Shared Channel, PUSCH;
   mapping the data to be sent to Virtual Resource Blocks, VRBs; and
   mapping the VRBs to Physical Resource Blocks, PRBs, in units of Resource Block, RB, bundle;
   wherein, the mapping of the VRBs to the PRBs in units of RB bundle, comprises:
   determining M VRB bundles with lower frequency and/or L VRB bundles with higher frequency in RBs occupied by the data channel;
   directly mapping, without using an interleaver, the M VRB bundles with lower frequency and/or L VRB bundles with higher frequency to PRB bundles with same indexes as the VRB bundles; and
   mapping remaining VRB bundles to corresponding PRB bundles using the interleaver;
   wherein, the M VRB bundles with lower frequency comprise:
   $M=N-\lfloor N/P \rfloor \times P$, wherein N is a quantity of RB bundles in a Band Width Part, BWP, and P is a quantity of rows or columns of the interleaver;
   wherein,
   the L VRB bundles with higher frequency comprise:
   $L=N-\lfloor N/P \rfloor -P$, wherein N is the quantity of RB bundles in a BWP, and P is the quantity of rows or columns of the interleaver.

2. The method of claim 1, wherein, P is the quantity of rows or columns of the interleaver, comprising:
   if the quantity of rows of the interleaver is fixed, P is the quantity of rows of the interleaver;
   if the quantity of columns of the interleaver is fixed, P is the quantity of columns of the interleaver.

3. The method of claim 1, wherein, the mapping of the VRB to a PRB in units of RB bundle, comprises:
   determining PRB bundle indexes corresponding to all VRB bundles through interleaved mapping; and
   inserting (C*R−N) nulls in a last row or last column of an interleaver, and ignoring nulls when reading out from the interleaver,
   wherein N is a quantity of RB bundles in a BWP, R is a quantity of rows of the interleaver, and C is a quantity of columns of the interleaver.

4. The method of claim 3, wherein, the inserting of (C*R−N) nulls in a last row or last column of an interleaver, comprises:
   inserted nulls do not occupy a last element position of the last row or last column of the interleaver.

5. The method of claim 3, wherein, the inserting of (C*R−N) nulls in a last row or last column of an interleaver, comprises:
   if VRB bundle indexes are written into the interleaver by row and read out from the interleaver by column, then inserting (C*R−N) nulls in the last row or last column of the interleaver by inserting (C*R−N) nulls in the last row of the interleaver;
   if VRB bundle indexes are written into the interleaver by column and read out from the interleaver by row, then inserting (C*R−N) nulls in the last row or last column of the interleaver by inserting (C*R−N) nulls in the last column of the interleaver.

6. The method of claim 1, wherein, before the mapping of the VRBs to the PRBs in units of RB bundle, the method further comprises:
   determining a quantity of RB bundles in a BWP and/or whether a size of a last RB bundle is less than L, and determining whether to map the VRBs to the PRBs in units of RB bundle according to a determining result, wherein L is a size of a RB bundle.

7. The method of claim 6, wherein, the determining of the quantity of RB bundles in a BWP, comprises:
   determining whether the quantity of RB bundles in the BWP is an integer multiple of the quantity of interleaver rows or the quantity of interleaver columns.

8. The method of claim 7, wherein, the determining of whether the quantity of RB bundles in the BWP is an integer multiple of the quantity of interleaver rows or the quantity of interleaver columns, comprises:
   if the quantity of interleaver rows is fixed, determining whether the quantity of RB bundles in the BWP is an integer multiple of the quantity of interleaver rows;
   if the quantity of interleaver columns is fixed, determining whether the quantity of RB bundles in the BWP is an integer multiple of the quantity of interleaver columns.

9. A computer device comprising a memory, a processor and a computer program that is stored on the memory and can run on the processor, wherein, the processor, when executing the computer program, implements a following method:
   determining data to be sent that is carried on a data channel PDSCH/PUSCH;
   mapping the data to be sent to VRBs; and
   mapping the VRBs to PRBs in units of RB bundle;
   wherein, the mapping of the VRBs to the PRBs in units of RB bundle, comprises:
   determining M VRB bundles with lower frequency and/or L VRB bundles with higher frequency in RBs occupied by the data channel;
   directly mapping, without using an interleaver, the M VRB bundles with lower frequency and/or L VRB bundles with higher frequency to PRB bundles with same indexes as the VRB bundles; and mapping remaining VRB bundles to corresponding PRB bundles using the interleaver;

wherein, the M VRB bundles with lower frequency comprise:

$M=N-\lfloor N/P \rfloor \times P$, wherein N is the quantity of RB bundles in a Band Width Part, BWP, and P is the quantity of rows or columns of the interleaver;

wherein, the L VRB bundles with higher frequency comprise:

$L=N-\lfloor N/P \rfloor \times P$, wherein N is the quantity of RB bundles in a BWP, and P is the quantity of rows or columns of the interleaver.

10. The computer device of claim 9, wherein, P is the quantity of rows or columns of the interleaver, comprising:

if the quantity of rows of the interleaver is fixed, P is the quantity of rows of the interleaver;

if the quantity of columns of the interleaver is fixed, P is the quantity of columns of the interleaver.

11. The computer device of claim 9, wherein, the mapping of the VRBs to PRBs in units of RB bundle, comprises:

determining PRB bundle indexes corresponding to all VRB bundles through interleaved mapping; and inserting (C*R−N) nulls in a last row or last column of an interleaver, and ignoring nulls when reading out from the interleaver, wherein N is a quantity of RB bundles in a BWP, R is a quantity of rows of the interleaver, and C is a quantity of columns of the interleaver.

12. A non-transitory computer readable storage medium, wherein, the computer readable storage medium stores a computer program performing a method of:

determining data to be sent that is carried on a data channel PDSCH/PUSCH;

mapping the data to be sent to VRBs; and mapping the VRBs to PRBs in units of RB bundle;

wherein, the mapping of the VRBs to the PRBs in units of RB bundle, comprises:

determining M VRB bundles with lower frequency and/or L VRB bundles with higher frequency in RBs occupied by the data channel;

directly mapping, without using an interleaver, the M VRB bundles with lower frequency and/or L VRB bundles with higher frequency to PRB bundles with same indexes as the VRB bundles; and mapping remaining VRB bundles to corresponding PRB bundles using the interleaver;

wherein, the M VRB bundles with lower frequency comprise:

$M=N-\lfloor N/P \rfloor \times P$, wherein N is the quantity of RB bundles in a Band Width Part, BWP, and P is the quantity of rows or columns of the interleaver;

wherein, the L VRB bundles with higher frequency comprise:

$L=N-\lfloor N/P \rfloor \times P$, wherein N is the quantity of RB bundles in a BWP, and P is the quantity of rows or columns of the interleaver.

13. The non-transitory computer readable storage medium of claim 12, wherein, P is the quantity of rows or columns of the interleaver, comprising:

if the quantity of rows of the interleaver is fixed, P is the quantity of rows of the interleaver;

if the quantity of columns of the interleaver is fixed, P is the quantity of columns of the interleaver.

14. The non-transitory computer readable storage medium of claim 12, wherein, before the mapping of the VRBs to the PRBs in units of RB bundle, the method further comprises:

determining a quantity of RB bundles in a BWP and/or whether a size of a last RB bundle is less than L, and determining whether to map the VRBs to the PRBs in units of RB bundle according to a determining result, wherein L is a size of a RB bundle.

15. The non-transitory computer readable storage medium of claim 14, wherein, the determining of the quantity of RB bundles in a BWP, comprises:

determining whether the quantity of RB bundles in the BWP is an integer multiple of the quantity of interleaver rows or the quantity of interleaver columns.

16. The non-transitory computer readable storage medium of claim 15, wherein, the determining of whether the quantity of RB bundles in the BWP is an integer multiple of the quantity of interleaver rows or the quantity of interleaver columns, comprises:

if the quantity of interleaver rows is fixed, determining whether the quantity of RB bundles in the BWP is an integer multiple of the quantity of interleaver rows;

if the quantity of interleaver columns is fixed, determining whether the quantity of RB bundles in the BWP is an integer multiple of the quantity of interleaver columns.

* * * * *